(12) United States Patent
Chang et al.

(10) Patent No.: US 8,779,442 B2
(45) Date of Patent: Jul. 15, 2014

(54) LED MODULE

(71) Applicant: Advanced Optoelectronic Technology, Inc., Hsinchu Hsien (TW)

(72) Inventors: Chao-Hsiung Chang, Hsinchu (TW); Hou-Te Lin, Hsinchu (TW); Ming-Ta Tsai, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/726,195

(22) Filed: Dec. 23, 2012

(65) Prior Publication Data

US 2013/0270590 A1    Oct. 17, 2013

(30) Foreign Application Priority Data

Apr. 16, 2012    (CN) .......................... 2012 1 0109246

(51) Int. Cl.
*H01L 33/00*        (2010.01)

(52) U.S. Cl.
USPC ............................................................. 257/79

(58) Field of Classification Search
USPC ................................ 257/98, 79, 88, E33.001
See application file for complete search history.

(56) References Cited

U.S. PATENT DOCUMENTS

| | | | |
|---|---|---|---|
| 8,278,678 B2 * | 10/2012 | Masui et al. .................... | 257/99 |
| 2006/0278882 A1 | 12/2006 | Leung et al. | |
| 2007/0158669 A1 * | 7/2007 | Lee et al. ......................... | 257/98 |
| 2007/0235743 A1 | 10/2007 | Lee et al. | |
| 2008/0194048 A1 | 8/2008 | Wang et al. | |
| 2008/0203412 A1 * | 8/2008 | Shyu et al. ....................... | 257/98 |
| 2009/0095967 A1 * | 4/2009 | Masui et al. .................... | 257/98 |
| 2009/0166664 A1 * | 7/2009 | Park et al. ....................... | 257/99 |
| 2010/0090239 A1 * | 4/2010 | Lin et al. ......................... | 257/98 |
| 2010/0148206 A1 | 6/2010 | Lin et al. | |
| 2010/0289051 A1 * | 11/2010 | Lee et al. ........................ | 257/98 |
| 2011/0068356 A1 * | 3/2011 | Chiang et al. ................... | 257/98 |
| 2012/0091487 A1 * | 4/2012 | Chan et al. ...................... | 257/98 |
| 2013/0161672 A1 * | 6/2013 | Hsieh ............................... | 257/98 |
| 2013/0234183 A1 * | 9/2013 | Tsai et al. ........................ | 257/98 |

FOREIGN PATENT DOCUMENTS

| | | |
|---|---|---|
| TW | 200735414 | 9/2007 |
| TW | 200802975 | 1/2008 |
| TW | 200834968 A | 8/2008 |
| TW | M404494 U1 | 5/2011 |

* cited by examiner

*Primary Examiner* — Thao P Le
(74) *Attorney, Agent, or Firm* — Novak Druce Connolly Bove + Quigg LLP

(57) ABSTRACT

An LED module comprises an LED and a lens matching with the LED. The lens comprises a light-guiding portion and a plurality of retaining portions protruded from the light-guiding portion. The LED includes a substrate, a first electrode and a second electrode mounted on the substrate. A plurality of through holes is defined in the first electrode and a second electrode, respectively. Each retaining portion includes a rugged portion. The retaining portions are inserted into the through holes correspondingly, and the rugged portion abuts the substrate. Glue is applied between the rugged portion and the substrate.

19 Claims, 6 Drawing Sheets

LED MODULE

BACKGROUND

1. Technical Field

The present disclosure generally relates to light sources, and particularly to a light emitting diode (LED) module.

2. Description of Related Art

A conventional LED module includes a substrate, at least an LED mounted on the substrate and at least a lens covering the at least an LED whereby light generated by the at least an LED can have a desired pattern of distribution. The lens is fixed to the substrate by glue directly coated on a flat surface of the substrate. However, the glue is difficult to be evenly distributed between the lens and the substrate, which results in unreliable attachment between the lens and the substrate. Therefore, performance of reliability of the LED module is unfavorably affected.

What is needed, therefore, is an LED module which can overcome the above mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe an LED module, in detail.

Figure 1:
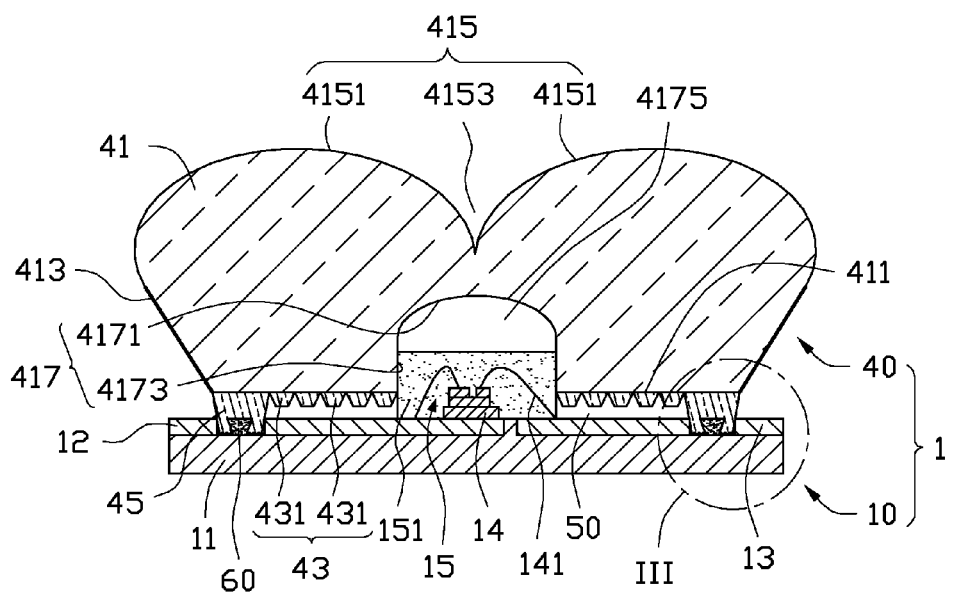
FIG. 1 is a schematic, assembled view of an LED module according to a first embodiment of the present disclosure.

Referring to FIG. 1, an LED module 1 according to a first embodiment of the present disclosure includes an LED 10 and a lens 40 matching with and covering the LED 10.

The LED 10 includes a substrate 11, a first electrode 12, a second electrode 13, an LED chip 14 and an encapsulant 15. The substrate 11 is flat. The first electrode 12 and the second electrode 13 are arranged on a top surface of the substrate 11 and spaced from each other. The LED chip 14 is mounted on a top surface of the first electrode 12. The LED chip 14 is electrically connected to the first electrode 12 and the second electrode 13 via metal wires 141. The encapsulant 15 encloses the LED chip 14 and the wires 141 therein. The encapsulant 15 is made of epoxy, silicon, glass or other transparent material which has good light-permeable and waterproof capabilities. In this embodiment, a plurality of fluorescent materials 151 may be doped within the encapsulant 15 to adjust the color of the light emitted from the LED chip 14.

Figure 2:
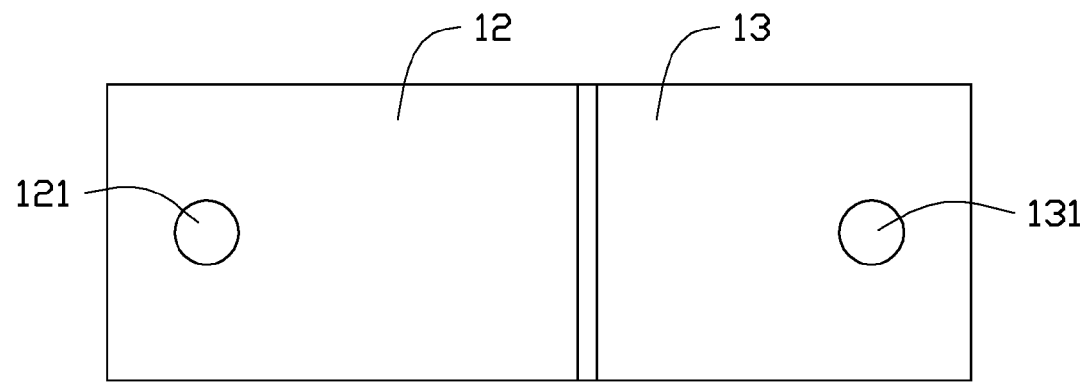
FIG. 2 is a top view of a circuit formed on a substrate of the LED module of FIG. 1.

Referring to FIG. 2, a through hole 121 is defined in the first electrode 12. A through hole 131 is defined in the second electrode 13. The through hole 121 and the through hole 131 are aligned with each other along a longitudinal direction of the substrate 11 and located at a longitudinal middle line of the substrate 11. The through holes 121, 131 are used to receive a part of the lens 40 therein.

The lens 40 covers the encapsulant 15 and the LED chip 14 to change the path of the light emitted from the LED chip 14, thereby improving the utilization rate of the light. The lens 40 is made of a transparent material with a good optical performance, such as PMMA (polymethyl methacrylate) or PC (polycarbonate).

In this embodiment, the lens 40 includes a light-guiding portion 41, a rough portion 43 and a pair of retaining portions 45.

The light-guiding portion 41 includes a curved top surface 415, a flat bottom surface 411 and an annular side surface 413 interconnecting edges of the top surface 415 and the bottom surface 411. The annular side surface 413 tapers along a top-to-bottom direction. A width of the top surface 415 along a direction parallel to the top surface of the substrate 11 is larger than that of the bottom surface 411. The side surface 413 is inclined, and extends downwardly and inwardly from an edge of the top surface 415 to a corresponding edge of the bottom surface 411. The top surface 415 is employed as a light-emergent surface of the LED module 1. Most of the light emitted from the LED 10 leaves the lens 40 from the top surface 415, and another part of the light leaves the lens 40 from the side surface 413.

The top surface 415 includes a pair of first curved surfaces 4151 cooperatively forming a wing-shaped configuration, whereby light emitted from the LED chip 14 can have a bat wing-shaped pattern of distribution after leaving the lens 40. The first curved surfaces 4151 are symmetrical. Each of the first curved surfaces 4151 is convex. Outer edge of each first curved surface 4151 connects a top edge of a corresponding side surface 413. Inner edges of the two first curved surfaces 4151 intersect at a joint 4153. The joint 4153 is located at a center of a top of the lens 40. The joint 4153 is located at a bottom of a recess in a central portion of the top of the lens 40. A distance between each first curved surface 4151 and the bottom surface 411 of the light-guiding portion 41 is gradually decreased from a central portion of the first curved surface 4151 to a periphery of the first curved surface 4151.

A cavity 417 is recessed from a central portion of the bottom surface 411 to receive the LED chip 14 therein. The cavity 417 is surrounded by a second curved surface 4171 and an annular surface 4173 connecting the second curved surface 4171 and the bottom surface 411. The second curved surface 4171 is convex to form a dome and is located over the LED chip 14. The center of the second curved surface 4171 is aligned with the joint 4153. The annular surface 4173 is perpendicular to the substrate 11. The second curved surface 4171 and the annular surface 4173 are employed as a light input surface of the lens 40. A width of the cavity 417 along a direction parallel to the top surface of the substrate 11 equals that of the encapsulant 15.

The rough portion 43 and the two retaining portions 45 are protruded downwardly from the bottom surface 411. The rough portion 43 includes a plurality of continuous protruding portions 431. The protruding portions 431 are evenly arrayed on the bottom surface 411 and located around the cavity 417. Each protruding portion 431 has the same shape and size. Each protruding portion 431 is inverted trapeziform, and tapers from a top end connecting the bottom surface 411 to a bottom end away from the bottom surface 411. An inner surface of each protruding portion 431 may be covered by a reflecting film (not shown) to reflect light in the lens 40 and toward the bottom surface 411 back to the interior of the lens 40. Edges of top ends of adjacent protruding portions 431 connect with each other, and the another parts of the adjacent protruding portions 431 are spaced from each other. The outer edges of the two outmost protruding portions 431 connect inner edges of the two retaining portions 45 respectively.

The rough portion 43 is located above and spaced from the two electrodes 12, 13. A gap 50 is defined between the rough portion 43 and the two electrodes 12, 13 for cool air passing therethrough to cool the LED chip 14. The encapsulant 15 is received in the cavity 417, and the side surface of the encapsulant 15 intimately contacts the annular surface 4173. The top end of the encapsulant 15 is spaced from the second curved surface 4171. An air chamber 4175 is defined between the top end of the encapsulant 15 and the second curved surface 4171. Meanwhile, the LED chip 14 is under the second curved surface 4171. A distance between the LED chip 14 and the second curved surface 4171 is larger than the focal length of the second curved surface 4171. In this state, light emitted from the LED chip 14 can radiate out of the lens 40 to have the bat wing-shaped pattern of distribution.

The two retaining portions 45 are protruded from the bottom surface 411 and located at an outer periphery of the rough portion 43. The retaining portions 45 are spaced from each other. The lens 40 is fixed to the substrate 11 by inserting the two retaining portions 45 into the through hole 121 and the through hole 131. A bottom end of each of the two retaining portions 45 abuts against the substrate 11.

Each retaining portion 45 is a frustum cone, and tapers from a top end connecting the bottom surface 411 to a bottom end away from the bottom surface 411. A height of the retaining portion 45 is larger than that of each protruding portion 431.

A Cartesian coordinate system is imposed to describe different positions of the retaining portion 45. A Z-axis of the Cartesian coordinate system is parallel to a height direction of the retaining portion 45. An X-axis of the Cartesian coordinate system is parallel to the longitudinal direction of the substrate 11. A Y-axis of the Cartesian coordinate system is parallel to a transverse direction of the substrate 11.

Figure 3:
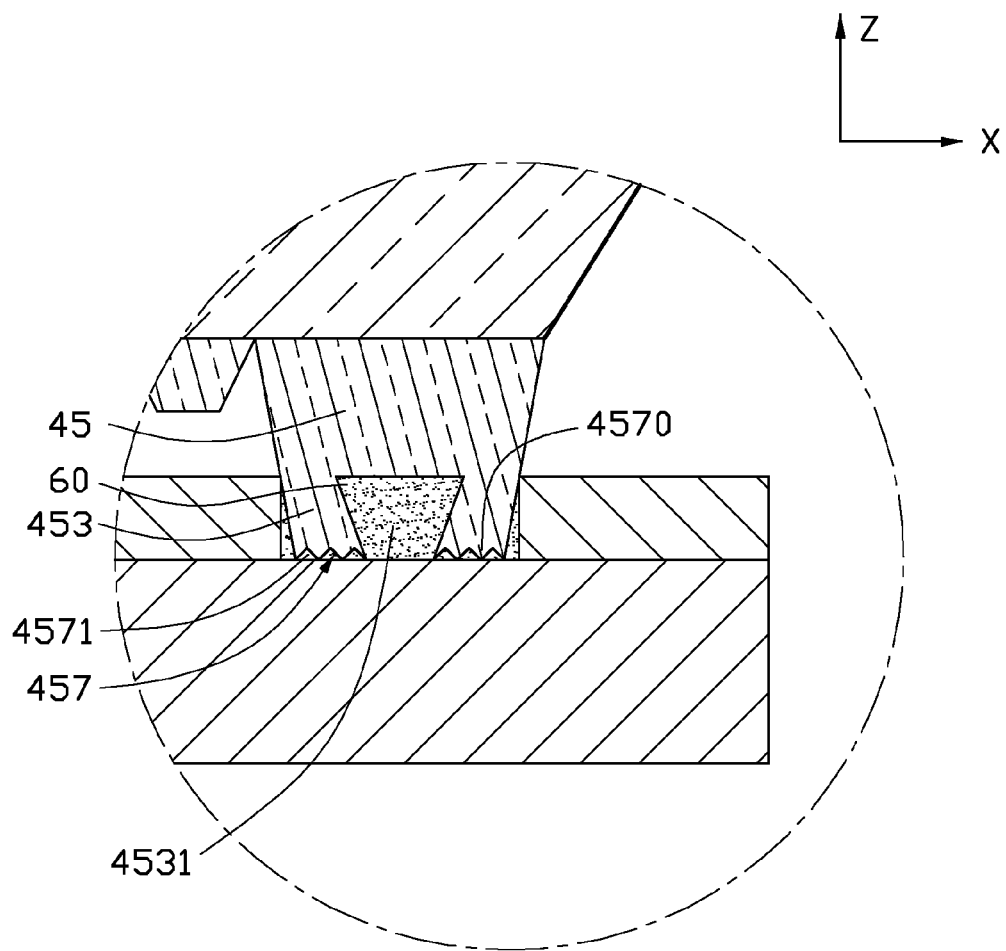
FIG. 3 is an enlarged view of a circled portion III of FIG. 1.

FIG. 3 shows an enlarged front side view of a first cavity 4531 in the XZ plane. The first cavity 4531 is recessed from a central portion of the bottom end of the retaining portion 45 toward a middle of the retaining portion 45 along the Z-axis. The first cavity 4531 extends through the retaining portion 45 along the Y-axis, which means that the first cavity 4531 is opened downwardly, forwardly and rearwards. The first cavity 4531 is used to receive glue 60 therein. The first cavity 4531 along the Z-axis tapers from a top end adjacent to the bottom surface 411 to a bottom end connecting the substrate 11, and a height of the first cavity 4531 equals a depth of the through hole 131(121).

The retaining portion 45 further includes two fixing parts 453 located at opposite sides of the first cavity 4531. Each fixing part 453 is located at a lower portion of the retaining portion 45. A front side view of each fixing part 453 in the XZ plane is trapeziform. Each fixing part 453 along the Z-axis direction tapers from the bottom end connecting the substrate 11 to the top end away from the substrate 11. A height of each fixing part 453 along the Z-axis equals a depth of the through hole 131(121).

Figure 4:
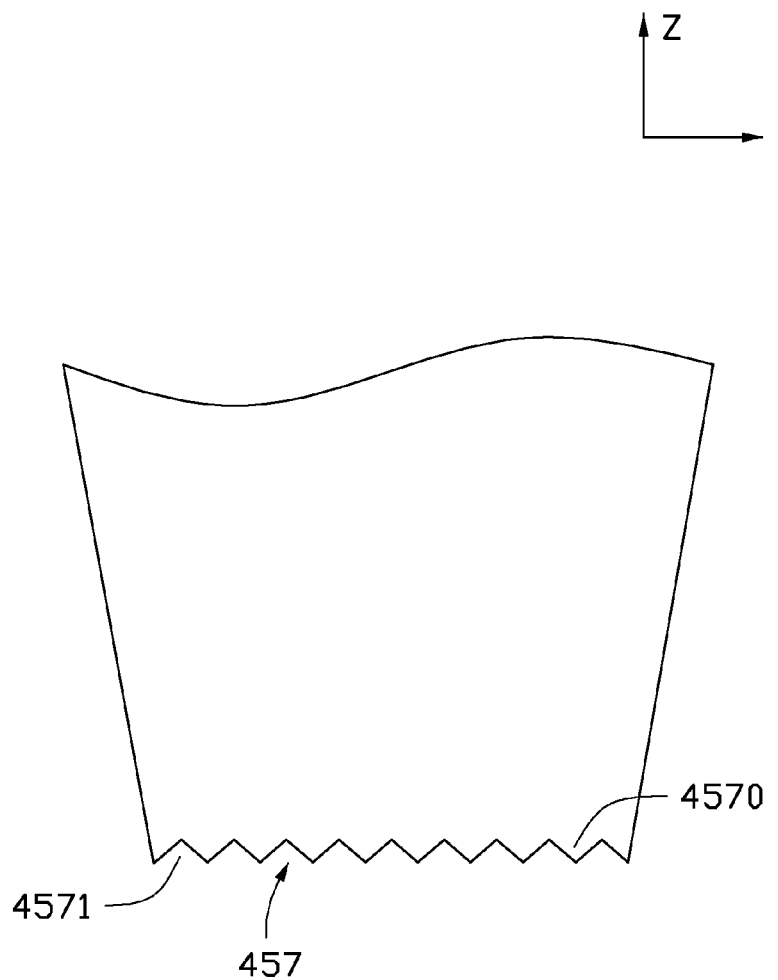
FIG. 4 is a lateral side view of a retaining portion in FIG. 3.

FIG. 4 shows a lateral side view of each fixing part 453 in the YZ plane. The lateral side view of the fixing part 453 is trapeziform, and each fixing part 453 along the Z-axis direction tapers from a top end adjacent to a bottom surface 411 to the bottom end away from the bottom surface 411.

Referring to FIG. 3 and FIG. 4, a rugged portion 457 is formed at a bottom end of each fixing part 453. The rugged portion 457 comprises a plurality of continues bulges 4570, whereby contacting areas between the fixing parts 453 and glue 60 on the substrate 11 is increased. Each bulge 4570 is in the form of a teeth. Furthermore, the rugged portion having the bulges 4570 increases a friction forces between the fixing parts 453 and the substrate 11. A receiving hole 4571 is defined between neighboring bulges 4570. The receiving hole 4571 is recessed along the Z-axis direction upwardly towards the light-guiding portion 41 from the bottom surface contacting the substrate 11. A side view of each receiving hole 4571 in the XZ plane or in the YZ plane is triangular. The receiving hole 4571 tapers from a bottom end contacting the substrate 11 to a top end away from the substrate 11.

When the lens 40 is assembled with the LED 10, the glue 60 is injected into the through hole 121,131; then, the retaining portions 45 are inserted into the corresponding through hole 121,131, until the rugged portions 457 of the retaining portion 45 abut on the top surface of the substrate 11. Such that, the fixing parts 453 are inserted into the through hole 121,131 and surrounded by the glue 60. The first cavity 4531 and the receiving holes 4571 are filled with the glue 60. At the same time, an outer surface of the retaining portions 45 abut edges of first and second electrodes 12, 13 defining the though holes 121,131 to secure the lens 40 to the substrate 11.

In this embodiment, more glue 60 connects the fixing parts 453 and the substrate 11, and a friction forces between the fixing parts 453 and the substrate 11 is further increased. Furthermore, the glue 60 filled into the first cavity 4531 and the receiving holes 4571 of the rugged portion 457 makes a connecting force between the retaining portions 45 and the substrate 11 increased. So, the lens 40 can be fixed to the substrate 11 more firmly. Furthermore, since the glue 60 is received in the first cavities 4531, the receiving holes 4571 and the through holes 121, 131, no contamination of the LED module 1 due to an overflow of the glue 60 is obtainable by the present disclosure.

Figure 5:
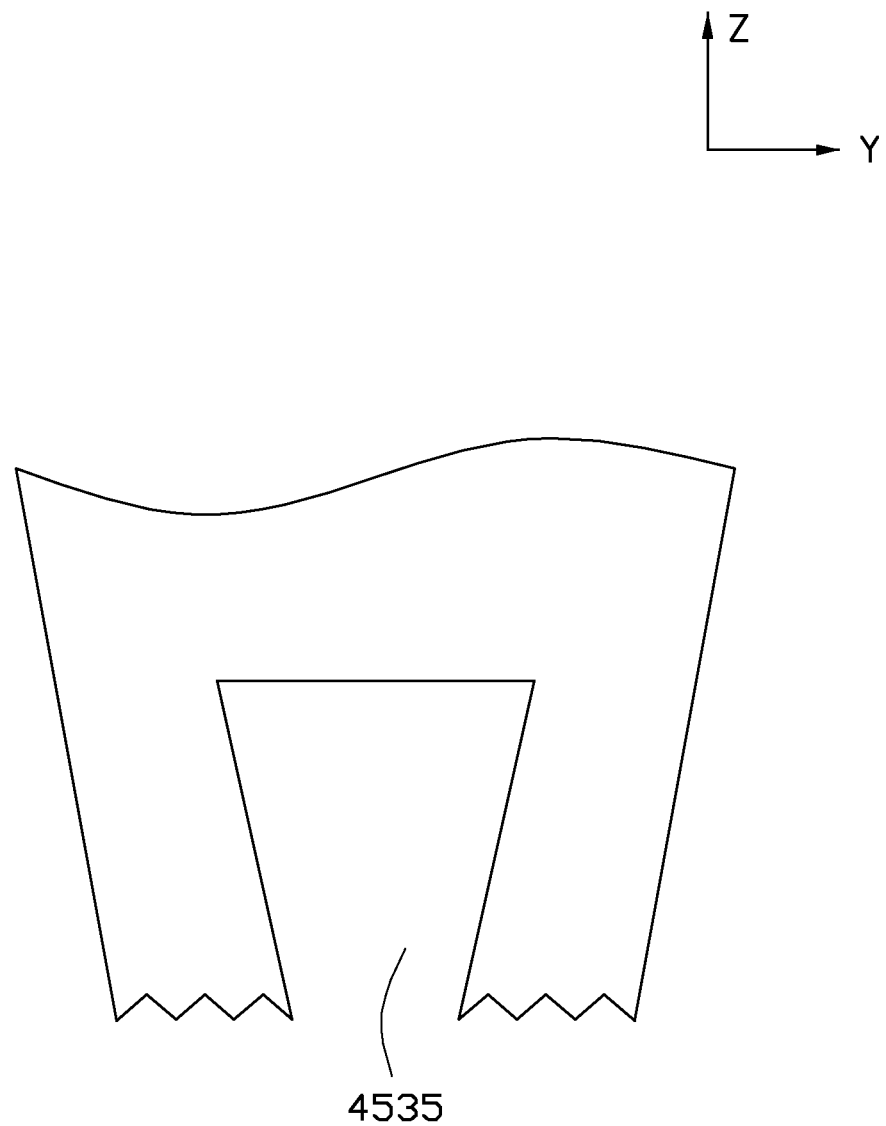
FIG. 5 is a side view of a retaining portion of an LED module according to a second embodiment of the present disclosure.

Referring to FIG. 5, in a second embodiment, a second cavity 4535 is further defined in a bottom end of the retaining portion 45. FIG. 5 shows a lateral side view of the second cavity 4535 in the YZ plane. The second cavity 4535 extends through the bottom end of the retaining portion 45. The second cavity 4535 extends through opposite lateral sides of the retaining portion 45 along X-axis direction. A lateral side view of the second cavity 4535 along X-axis is trapeziform, and the second cavity 4535 along Z-axis direction tapers from a top end adjacent to the light-guiding portion 41 to a bottom end away from the light-guiding portion 41. The second cavity 4535 communicates with the first cavity 4531. A height of the second cavity 4535 is higher than that of the first cavity 4531. So that, when the fixing parts 453 are inserted into the through hole 121(131), a top end of the second cavity 4535 is located above the first electrode 12 and the second electrode 13. Therefore, it is easy to inject the glue 60 into the through hole 121(131) from a space in the top end of the second cavity 4535 which is located above the two electrodes 12, 13.

Figure 6:
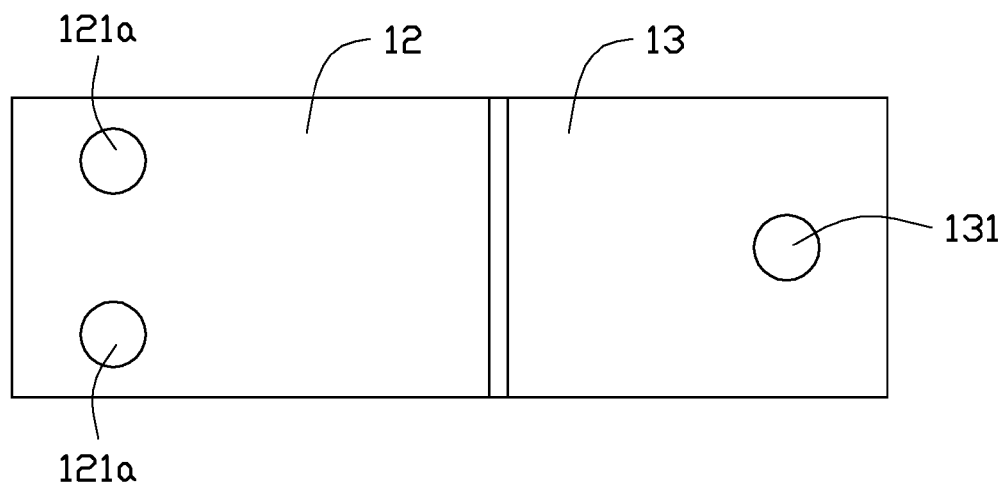
FIG. 6 is a top view of a circuit formed on a substrate of an LED module according to a third embodiment of the present disclosure.

Alternatively, the number of the retaining portion 45 and the number of the through hole 121(131) is not limited to the above disclosed. Referring to FIG. 6, in a third embodiment, the number of the retaining portion 45 is three, and the number of the through hole 121(131) corresponding to the retaining portion 45 is also three. The three retaining portions 45 are inserted into the corresponding through holes 121a, 131. A line connecting the three holes forms a triangle, whereby the lens 40 would be fixed more firmly.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED module comprising:
    an LED;
    a lens covering the LED, the lens comprising a light-guiding portion over the LED and a plurality of retaining portions protruded downwardly from the light-guiding portion, the LED comprising a substrate, a first electrode and a second electrode mounted on the substrate and an LED chip, a plurality of through holes being defined in the first electrode and the second electrode, respectively, each retaining portion including a rugged portion, the retaining portions being inserted into the through holes correspondingly, and the rugged portions of the retaining portions abutting the substrate, the LED chip being electrically connected to the first and second electrodes; and
    glue filled in the through holes and in a space between the rugged portions and the substrate to securely connect the retaining portions and the substrate together.

2. The LED module as claimed in claim 1, wherein the rugged portion is formed in a bottom end of each retaining portion, the rugged portion comprises a plurality of bulges.

3. The LED module as claimed in claim 2, wherein a receiving hole is defined between neighboring bulges.

4. The LED module as claimed in claim 3, wherein the bulges are in the form of teeth.

5. The LED module as claimed in claim 4, wherein the receiving hole tapers from a bottom end adjacent to the substrate to a top end away from the substrate.

6. The LED module as claimed in claim 1, wherein a first cavity is recessed from a central portion of the bottom end of the retaining portion toward a middle of the retaining portion to receive the glue therein.

7. The LED module as claimed in claim 6, wherein the first cavity extends through the bottom end of the retaining portion along a direction perpendicular to a longitudinal direction of the substrate.

8. The LED module as claimed in claim 6, wherein a height of the first cavity equals a depth of the through hole.

9. The LED module as claimed in claim 6, wherein the first cavity tapers from a top end adjacent to the light-guiding portion to a bottom end away from the light-guiding portion.

10. The LED module as claimed in claim 7, wherein a second cavity is defined in the bottom end of the retaining portion to receive the glue therein.

11. The LED module as claimed in claim 10, wherein the second cavity extends through the bottom end of the retaining portion along the longitudinal direction of the substrate, and the first and second cavities communicate with each other.

12. The LED module as claimed in claim 11, wherein a height of the second cavity is higher than that of the first cavity, so that a top end of the second cavity is above the first electrode and the second electrode.

13. The LED module as claimed in claim 11, wherein a width of the second cavity tapers from a top end adjacent to the light-guiding portion to a bottom end away from the light-guiding portion.

14. The LED module as claimed in claim 1, wherein the number of the retaining portions is three, the number of the through holes corresponding with the retaining portions is also three, the three retaining portions are inserted into the corresponding through holes, a line connecting the three holes forms a triangle, whereby the lens can be fixed to the substrate more firmly.

15. An LED module comprising:
    a substrate, a first electrode and a second electrode mounted on the substrate, an LED chip mounted on one of the first and second electrodes and electrically connecting with the first and second electrodes, and a lens matching with the LED chip, the lens comprising a light-guiding portion and a plurality of retaining portions protruded downwardly from the light-guiding portion, a plurality of through holes being defined in the first electrode and the second electrode, the retaining portions being inserted into the through holes to assemble the lens with the substrate, a first cavity being recessed upwardly along a height direction from a central portion of a bottom end of each of the retaining portions toward a middle of each retaining portion, and glue being received in the first cavity to securely connect each retaining portion and the substrate together.

16. The LED module as claimed in claim 15, wherein a rugged portion is formed in a bottom end of each retaining portion, the glue being also received in the rugged portion to securely connect each retaining portion and the substrate together.

17. The LED module as claimed in claim 15, wherein the first cavity extends through a periphery of the bottom end of each retaining portion along a first direction, and a height of the first cavity equals a depth of the through hole.

18. The LED module as claimed in claim 17, wherein a second cavity is further defined in the bottom end of each retaining portion to receive the glue therein, and the second cavity extends through the periphery of the bottom end of each retaining portion along a second direction which is different from the first direction.

19. The LED module as claimed in claim 18, wherein a height of the second cavity is higher than that of the first cavity, whereby the glue can be injected into the first and the second cavities via a top end of the second cavity.

* * * * *